United States Patent [19]

Wellman et al.

[11] Patent Number: 4,990,782
[45] Date of Patent: Feb. 5, 1991

[54] RADIATION SHIELD FOR THERMOELECTRICALLY COOLED INFRARED DETECTORS

[75] Inventors: William H. Wellman; Russell D. Granneman, both of Goleta, Calif.

[73] Assignee: Santa Barbara Research Center, Goleta, Calif.

[21] Appl. No.: 370,556

[22] Filed: Jun. 23, 1989

[51] Int. Cl.⁵ .................................................. G01J 5/08
[52] U.S. Cl. .................................. 250/352; 250/353; 250/370.15; 350/276 SL
[58] Field of Search .................... 250/352, 353, 370.15; 350/276 SL

[56] References Cited

U.S. PATENT DOCUMENTS

| | | | |
|---|---|---|---|
| 2,738,700 | 3/1956 | Taylor | 350/449 |
| 3,445,659 | 5/1969 | Guimento et al. | 250/352 |
| 3,648,056 | 3/1972 | Buttweiler et al. | 250/239 |
| 4,217,026 | 8/1980 | Radovich | 350/580 |
| 4,339,748 | 7/1982 | Guscott et al. | 340/555 |
| 4,431,917 | 2/1984 | Gibbons | 250/332 |
| 4,507,551 | 3/1985 | Howard et al. | 250/216 |
| 4,542,963 | 9/1985 | Linlor | 350/537 |
| 4,820,923 | 4/1989 | Wellman | 250/352 |

FOREIGN PATENT DOCUMENTS

| | | | |
|---|---|---|---|
| 495633 | 4/1976 | U.S.S.R. | 250/353 |
| 2115143 | 9/1983 | United Kingdom | 250/353 |

*Primary Examiner*—Constantine Hannaher
*Attorney, Agent, or Firm*—W. C. Schubert; W. K. Denson-Low

[57] ABSTRACT

A radiation shield 40 is mounted to an uncooled portion, such as an outer case 14, of an IR detector assembly 10 such that it surrounds a thermoelectric cooler 16 and a radiation detector 18. The shield 40 has a curved reflective upper surface 42 having the shape of a toric segment and cylindrical or rectangular reflective sidewalls 44 for imaging the detector 18 and the upper cooler stage upon the tops and sides of lower and slightly warmer cooler stages, which absorb and eliminate radiative energy. This beneficially reduces the heatload upon the coldest stage by excluding hotter surfaces from its view, and by inhibiting reflective couplings of unwanted energy admitted by aperture 46. An aperture 46 defines the effective coldstop for the detector 18.

26 Claims, 4 Drawing Sheets

FIG. 1

PRIOR ART

(A) ALONG WIDTH,
OR NARROW DIMENSION

FIG. 6b

(B) ALONG LENGTH
OR WIDE DIMENSION

FIG. 7a

(A) ALONG WIDTH
OR NARROW DIMENSION

FIG. 7b (B) ALONG LENGTH
OR WIDE DIMENSION

FIG. 5

| STAGE # | T (K) | AREA (SQ. CM.) LATERAL−CUTOUT+VERTICAL=TOTAL |
|---|---|---|
| 6 | 185 | 0.44−0+0.47=0.91 |
| 5, 4 | 231 | 0.99−0.44+1.17=1.72 |
| 3, 2 | 277 | 2.24−0.99+1.76=3.01 |
| 1 CHASSIS | 323 | |

FIG. 8.

| T (at +50°C AMBIENT) (K) | $\int_{3.0\,\mu m}^{4.5\,\mu m} W(\lambda)\,d\lambda$ ($\mu W/cm^2$) | ($ph/s \cdot cm^2$) | $\int_{3.0\,\mu m}^{5.0\,\mu m} W(\lambda)\,d\lambda$ ($\mu W/cm^2$) | ($ph/s \cdot cm^2$) | $\int_{0}^{\infty} W(\lambda)\,d\lambda$ ($mW/cm^2$) |
|---|---|---|---|---|---|
| 185 | 0.2 | 4.2 E12 | 1. | 1.9 E13 | 6.64 |
| 231 | 8.0 | 1.7 E14 | 24. | 5.5 E14 | 16.14 |
| 277 | 99.0 | 2.0 E15 | 240. | 5.4 E15 | 33.37 |
| 323 | 620.0 | 1.3 E16 | 1280. | 2.8 E16 | 61.71 |
| 257 | | | | | 24.61 |
| 297 | | | | | 44.11 |

RADIATION SHIELD FOR THERMOELECTRICALLY COOLED INFRARED DETECTORS

FIELD OF THE INVENTION

This invention relates generally to radiation shields for radiation detectors and, in particular, to a radiation shield having uncooled case mounted elements including shaped reflecting elements which generate an optically equivalent effect of a physical attachment to a cold stage.

BACKGROUND OF THE INVENTION

High performance infrared detector packages generally employ some form of coldshielding to limit radiation on the detector element in order to maintain an optimum performance available within the given characteristics of the optical system, object and detector. Typically such coldshields are mounted upon the cold focal plane to establish an efficient definition of the desired ray cone. However, this technique increases both the physical and the thermal mass at the cryogenic focal plane.

Warmshielding, employing an uncooled reflector, has also been employed in cryogenic infrared detector packages in order to reduce the physical size of the coldshield. Warmshields block radiation from outside the detector's field of view, but may still increase heatload and thermal mass on the cooler due to a requirement that they image the detector upon a cold target, typically the focal plane surrounding the detector and/or the coldshield.

A particular problem associated with cryogenic packages that employ thermoelectrically cooled detectors is that a small increase in heatload at the coldest stage or stages significantly increases the cold-end temperature and/or significantly increases the power dissipated by the cooler. For example, one known type of thermoelectric cooler, operated with a heatsink temperature of 50° C. that attains a detector stage temperature of −88° C. (185 K) experiences a temperature increase under heatload of approximately 0.3° C/mW Thus, an additional cold end heatload of 10 mW increases the detector temperature from 185 K to approximately 188 K.

It is therefore one object of the invention to provide a radiation shield for a cryogenically cooled radiation detector that does not increase either the physical or the thermal mass at the detector plane.

It is another object of the invention to provide a radiation shield for a cryogenically cooled radiation detector that significantly reduces radiative transfer into the coldest stages of a thermoelectric cooler, thereby lowering the temperature of the detector and/or reducing cooler power consumption.

It is another object of the invention to provide a radiation shield for a cryogenically cooled radiation detector that improves the overall detector assembly ruggedness and producibility by mounting the shield to structure other than a thermoelectric cooler.

It is still another object of the invention to provide a radiation shield for a cryogenically cooled radiation detector that provides a physically large shield cantilevered forward of the detector and that permits an optimum positioning of the cold aperture stop relative to the detector.

It is a further object of the invention to place energy absorbing materials within the radiation shield at locations where temperatures are sufficiently low that unwanted radiative self-emission is not introduced, and where optical reflections are intercepted, so that extraneous energy is eliminated and not coupled through an integrating-sphere effect into the coldest, or detector, stage. The energy so inhibited from this unwanted transfer includes energy that enters the coldstop obliquely and is not directly incident upon the coldest stage, as well as energy that has been reflected by the coldest stage.

SUMMARY OF THE INVENTION

The foregoing and other problems are overcome and the objects of the invention are met by an uncooled radiation shield for a cryogenically cooled radiation detector, the shield being physically mounted to structure other than a thermoelectric cooler. The shield has surfaces that image the detector and coldest stages of the thermoelectric cooler onto the top and side surfaces of lower and relatively warmer cooler stages that, however, are sufficiently cool such that radiative self-emission is insignificant.

In accordance with one aspect of the invention there is disclosed a radiation shield for reflecting radiation originating from a surface region maintained at a cold temperature away from that surface region. The radiation shield includes a first reflector for being positioned over the surface region and having an interior surface shape corresponding to a toric segment for reflecting any radiation originating from the surface region away from the surface region. The radiation shield also includes, as a matter of preference but not of necessity, a second reflector coupled to the first reflector for guiding radiation originating from the surface region and reflecting from the first reflector away from said the first reflector.

The radiation shield also includes an absorbing region as part of one or more the aforesaid stages of the thermoelectric cooler, the absorbing region being warmer than the coldest stage but still sufficiently cold that unwanted radiative self-emission is not introduced along the reverse path to the coldest stage.

In accordance with another aspect of the invention there is disclosed a radiation detector assembly that includes a radiation detector means having a surface for receiving radiation to be detected and a cooler having a first end portion thermally coupled to the detector for cooling the detector and a second opposing end portion. The assembly further includes a radiation shield disposed around the detector and at least partially enclosing a length of the cooler. The radiation shield includes a first reflector having an aperture for admitting radiation to the surface of the detector; the first reflector having an interior surface shape corresponding to a toric segment and facing the detector for reflecting radiation originating from the surface of the detector away from that surface. As a matter of preference and not of necessity, the radiation shield further includes a second reflector coupled to the first reflector for guiding radiation reflecting from the first reflector away from uncooled outer walls and towards the second end of the cooler.

In accordance with a method of the invention, there is disclosed for use in a radiation detector assembly having an IR radiation detector thermally coupled to an upper stage of a thermoelectric cooler for cooling the detector to a desired operating temperature, a method of decreasing a heat load upon the upper stage of the thermoelectric cooler. The method includes the steps of (a) reflecting, with a first reflector having a reflecting surface having the shape of a toric segment, thermal radiation emanating from the detector and from an upper surface of the upper stage, the radiation being reflected to a position below the upper stage, (b) guiding the reflected thermal radiation down along the cooler and towards a warmer, lower stage by reflecting the thermal radiation with at least one second reflector which is spaced away from and which surrounds the upper stage, and (c) absorbing the thermal radiation at a position away from and below the upper stage. The radiation is absorbed at a position having a sufficiently low temperature such that unwanted thermal emittance is not introduced along a reverse path back to the coldest upper stage.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

In order to illustrate the benefits made possible by the radiation shield of the invention, reference will first be made to FIG. 1 which shows a simplified cross-sectional view of a thermoelectrically cooled detector assembly 10 of the prior art. Assembly 10 includes a backplate or chassis 12 to which are mounted a dewar vacuum shell 14 and a six stage (1-6) thermoelectric cooler 16. Mounted to the sixth and coldest stage of the cooler 16 is an IR radiation detector chip 18 having an associated substrate 20 and hookup wiring 22. Electrical cabling 24 couples the detector 18 to associated electronics (not shown). A coldshield 26 having an aperture 28 defining a coldstop is mounted to the second stage of the cooler 16 and is cooled thereby. A dewar window 30 is positioned relative to the aperture 28 to admit IR radiation into the assembly 10 for viewing by the detector 18. The sixth stage of the cooler 20 and detector 18 mounted thereupon typically attains a coldest temperature of approximately 185 K under ambient temperature conditions of 323 K ($+50°$ C.), although the exact temperature is not critical to this invention. The cooler 16 has a shape defined by larger, higher temperature stages positioned beneath smaller, lower temperature stages. The resulting somewhat conical shape of the cooler 16 is exploited by the radiation shield of the invention as will be described below.

It should be noted that the coldshield 26 is not required to be mounted to the coldest stage of the cooler 18 in that thermal, as opposed to photon noise, dominates detector performance at 185 K operating temperatures. If the coldshield 26 were cooled further by mounting it to the coldest stage, only an insignificant reduction in detector 18 background flux would occur while radiative transfer into the coldshield would be conducted directly to the coldest stage increasing coldest-stage heatloads, thereby raising the detector 18 temperature and degrading performance. Furthermore, mounting the coldshield 18 to the coldest cooler stage would detrimentally reduce the ruggedness of the assembly 10.

Figure 1:
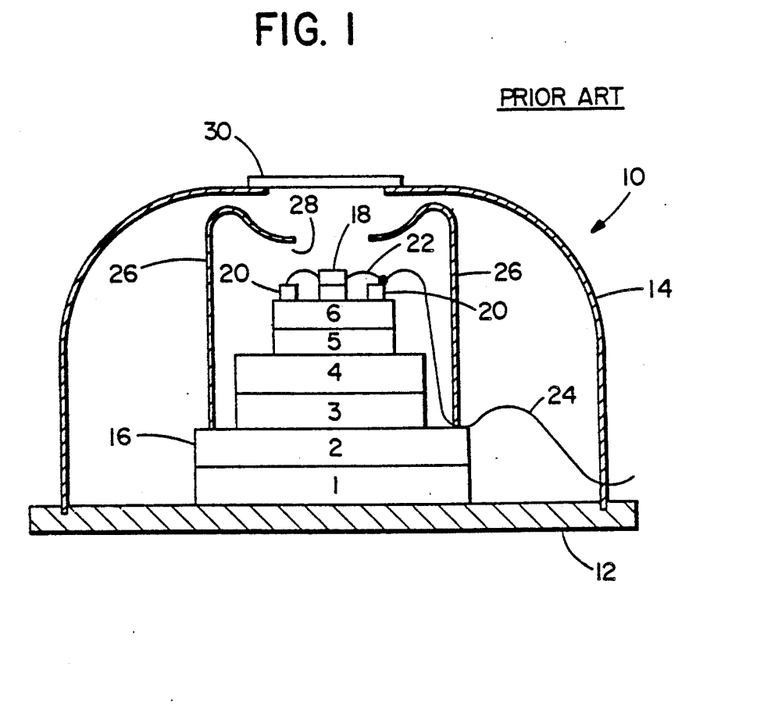
FIG. 1 is simplified side cut-away view of a radiation detector assembly of the prior art having a coldshield mounted to an intermediate stage of a thermoelectric cooler unit.
Figure 2:
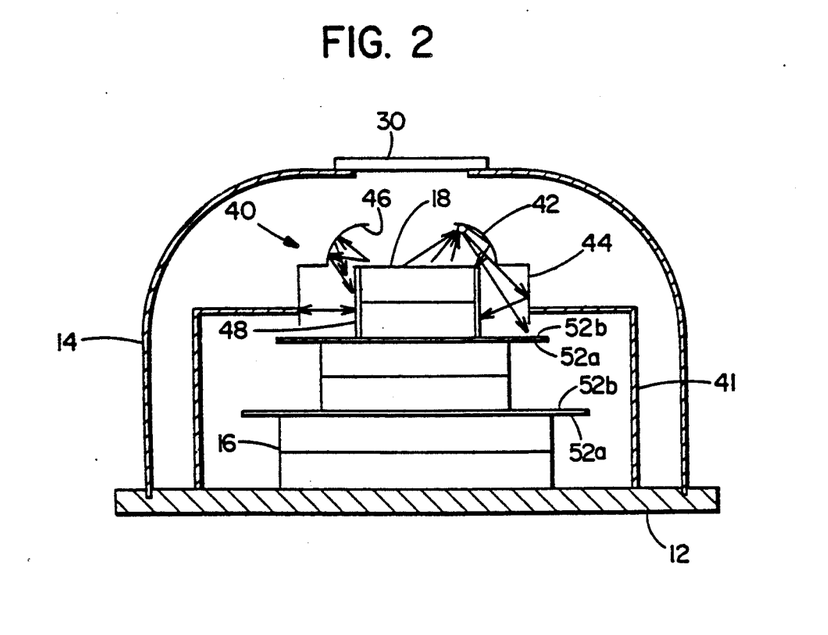
FIG. 2 is a simplified side cut-away view of the assembly of FIG. 1 having one embodiment of the radiation shield of the invention installed therein.

Referring now to FIG. 2 there is shown a simplified view of the assembly 10 of FIG. 1 wherein the coldshield 26 is replaced by the uncooled radiation shield 40 of the invention. It can be seen that the shield 40 is mounted via mounting apparatus 41 to the outer case of the assembly 10 and is not affixed to any part of cooler 16. Furthermore, the shield 40 has a curved reflective upper surface 42 having the shape of a toric segment and circular cylindrical or rectangular parallelepiped reflective sidewalls 46 for imaging the detector 18 and the upper cooler stage upon the tops and sides of lower and warmer cooler stages. This beneficially reduces the heatload upon the coldest stage by excluding warmer surfaces from its view. An aperture 46 defines the effective coldstop for the detector 18.

It should be noted that, as used herein, radiation that is said to be reflected away from the coldest stage and detector to a "lower" stage or stages is reflected in a general direction away from the aperture 46 and towards warmer stages.

The shield 40 of the invention exploits an important optical characteristic of toric reflectors, that is, toric reflectors image a point into a focussed annular region which surrounds the point. Therefore points of the detector 18 and the coldest cooler stage are imaged into rings surrounding the detector and the coldest stage. In accordance with the invention, the rings are further imaged beyond the edge of the detector 18 and the coldest stage of the cooler and eventually upon cooled absorptive surface(s) 52b below the detector and coldest stage. Furthermore, this optical property of toric reflectors overcomes several problems associated with many conventional reflectors that image points to points; that is, total ray blockage does not occur when reflective obstructions such as cabling lie within the imaged ring, and also ghost imaging and optical crosstalk are not generated in that reflections from points of the detector 18 are not imaged back upon the detector.

Figure 4:
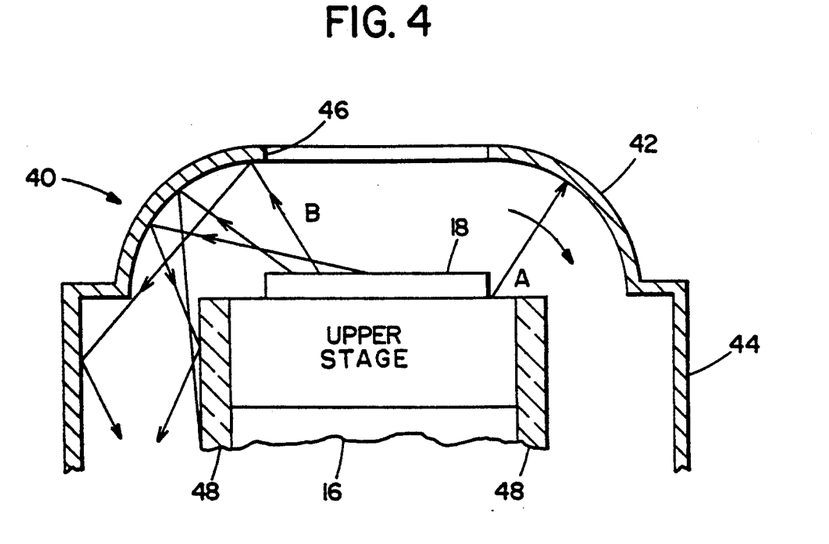
FIG. 4 is an enlarged view of a portion of the shield 40 of FIG. 2 which illustrates the surface geometry of the toric segment reflector and the redirection of rays originating at points on the detector beyond the edge of the detector stage and to absorptive surfaces behind the detector.

As can be seen in reference to FIG. 4 the toric shape of the reflector 42 is generated by placing the surface generating point A on or near the edge of detector 18. This orients the toric surface of reflector 42 for reflecting rays B behind the detector 18 and to the warmer and larger cooler 16 stages. Any ray from the detector 18 is reflected away from the detector since the angle of reflection from the toric surface is equal and opposite to the angle of incidence, these angles being measured with respect to the reflector 42 surface normal which approximately intercepts the edge of the detector. The optimization of the shape and placement of reflector 42 is preferably achieved through known optical ray tracing techniques in order to achieve the lowest flux reflections upon the coldest cooler stage. In general, this involves substantially a stray-light analysis as opposed to an image optimization analysis as is typically performed with reflectors. Furthermore, the exact placement of the toric pivot, both radially and in height, is best determined for a particular application by ray tracing techniques.

In that precise imaging is not required it should be noted that while the overall toric shape and surface finish of the reflector are important, the precision with which the surface is formed is not. For example, satisfactory reflectors have been fabricated by a sequence of lathe-turning, polishing, and gold-plating operations.

Another feature of the invention is the containment of energy within distinct zones of similar temperature. This provides that, even if rays strike reflective surfaces such as wiring, the rays are re-reflected by the reflective sidewalls 44 of the radiation shield until the rays strike an absorbing surface. Preferably, the upper side surfaces of the cooler 16 are enclosed within an optically reflective and thermally insulating sheath 48. One suitable material for the sheath 48 is a gold-plated polyimide plastic of a type commonly used in fine-line electronics cables. Thus, the downward reflection of rays is preserved by the smooth, vertical sidewalls of the upper cooler stage rather than being interrupted by the normally irregular cooler surfaces. This downward reflection of rays furthermore serves to dispose of energy admitted through the aperture 46, by directing it onto absorber 52b.

Figure 3A:
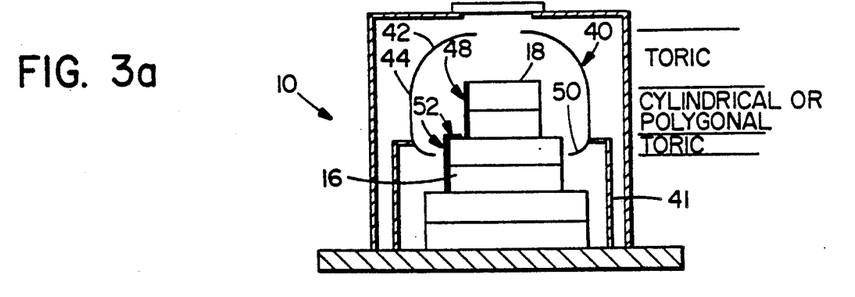
FIG. 3a shows another embodiment of the radiation shield of the invention that has a toric-cylindrical-toric geometry for redirecting and confining IR rays towards intermediate cooler stages.
Figure 3B:
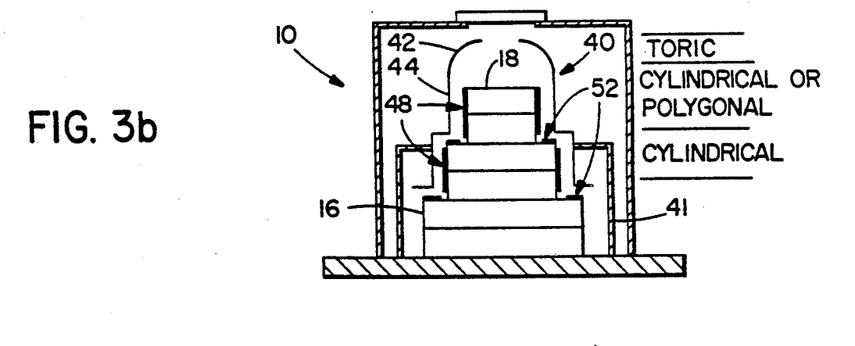
FIG. 3b shows another embodiment of the radiation shield of the invention having a toric-cylindrical-cylindrical geometry for containing radiation within zones of similar temperature.

The single toric segment reflector 42 is readily fabricated as are the lower cylindrical or rectangular reflector segments. If desired, and as shown in FIG. 3a, a lower toric reflector 50 can be provided to direct rays more inwardly and towards the intermediate temperature stages. Furthermore, and as shown in FIG. 3b and FIG. 2, for many applications it may be preferable to cause the shield 40 to closely follow or fit the shape of the cooler 16. For some applications where additional height is desired multiple toric reflectors can be provided further from the detector 18 than primary toric shield 42, in a manner as shown in U.S. Pat. No. 4,820,923, in order to direct energy across the central volume of the assembly 10 to avoid interference with the lower toric shield.

Further in accordance with the invention certain thermoelectric cooler 16 stages are provided with one or more extensions 52 to their thermally conductive plates in order to better control radiative transfer. The lower surface 52a of each plate 52 is preferably plated or otherwise treated to increase reflectance and decrease absorptance while the upper surface 52b is treated to be absorptive for viewing by the reflective shield, thereby effectively forming an exit aperture for disposing of energy that otherwise might be reflected back to the coldest stage. The side surfaces of the upper cooler stage(s) are sheathed and at least in part made reflective, as noted above, to augment imaging upon the lower absorptive areas, thereby improving this desirable absorption of unwanted energy. Another desirable effect is to prevent the intermediate temperature cooler stages from viewing hotter or case-temperature surfaces; instead these intermediate stages are reimaged upon themselves or upon stages which are only slightly warmer than themselves.

To better appreciate the benefits achieved by the use of the radiation shield of the invention, the results of a comparative analysis between the conventional coldshield 26 of FIG. 1 and the uncooled reflector 40 of FIG. 2 will now be given.

Figure 5:
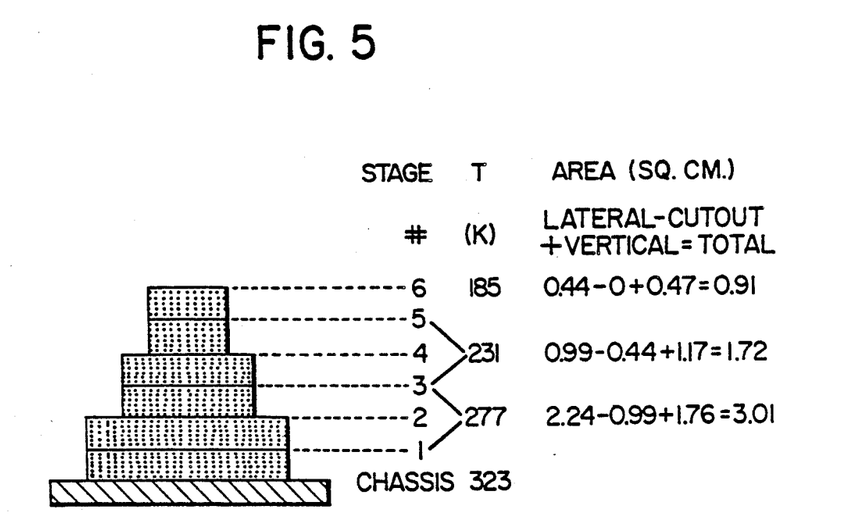
FIG. 5 shows the temperature and area profile of a six stage thermoelectric cooler.

For this analysis the cooler 16 is modeled as shown in FIG. 5, and includes typical temperatures and surface areas at each stage. The model represents a typical six stage thermoelectric cooler that attains a coldest stage temperature of approximately 185 K under worst case ambient conditions of $+50°C$. The cooler model considers both lateral and vertical surface areas. For each stage the surface area excludes the "footprint" of an overlying stage and includes the areas of above and below half-sides. In the model the topmost cooler stage is assumed to have a circular cylindrical shape with a diameter of 7.5 mm. The cooler stage heights are 2.0 mm and the stage lateral dimensions are taken as increasing in the ratio of 1.5:1 at every other stage. Rectangular or square shapes of the same areas would yield similar results. The upper stage absorption is taken to be 50% (0.5 W/W) which allows for reflective gold wiring over half the surface of otherwise absorptive materials such as ceramic, adhesive, Si or HgCdTe. The effective upper stage area is 0.9 cm$^2$.

As shown in FIG. 1, the conventional true coldshield 26 is mounted upon the second stage of the cooler 16. The heatload of the coldshield is minimized by gold-plating the shield exterior to reduce absorption. Still, with an exterior area of 6 cm$^2$ and an absorptance conservatively estimated as 3%, the radiative transfer from the outer housing 12 at 323 K ($+50°$ C.) to the coldshield 26 at 277 K is approximately 62 mW/cm$^2 \times$ 6.0 cm$^2 \times$ 0.03 W/W = 11 mW. Coupled into the second stage of a cooler that dissipates 3 W while operating, this 11 mW heatload is not significant.

However, due to the necessary thinness of the coldshield 26 and the consequent significant thermal resistance, this heatload causes some rise in shield temperature, for example, approximately 20° C. to a coldshield temperature of 297 K. This heat rise is critical if the coldshield interior is blackened, hence capable of emitting significant flux. At 297 K, radiant emittance is 44 mW/cm$^2$ over the full spectral band. Because the shield 26 surrounds the cold stage it can be shown that a flux of 44 mW/cm$^2 \times$ 0.9 cm$^2 \times$ 0.5 W/W, or approximately 20 mW, is incident upon the coldest stage.

If the coldshield 26 interior is reflective, not blackened, there is an apparent emittance because the shield reflects objects that it encloses. This can be considered a diffuse emittance for it is due to reflections not having any coherent imaging. The equivalent shield temperature can be cooler than the actual temperature for it is both an area-weighted and an emittance-weighted average of objects within the cavity. At an estimated equivalent temperature of 257 K and coldshield reflectance of 97% the radiant emittance is 25 mW/cm² over the full spectral band and a flux of 25 mW/cm²×0.9 cm²×0.97×0.5 W/W, or approximately 11 mW, is incident upon the coldest stage.

Also, for a reflective shield at an estimated temperature of 297 K and emittance of 3%, direct radiance upon the coldest stage is 44 mW/cm²×0.5 W/W ×0.9 cm²×0.03, or approximately 1 mW.

If the coldstop 28 is taken to be an 0.185×0.055 inch aperture at an equivalent height of 0.04 inches above the image plane, the coldstop 28 subtends a solid angle of approximately 1.7 steradians. Through it, energy within the dewar also is reflected upon the detector 18 in that the stop is placed well below the bandpass filter of window 30. This is because the window 30 and coldshield exterior are reflective and because the geometry allows substantial reflections of warm objects within the dewar, such as the dewar case and base. At conservatively estimated reflection-coupling efficiencies of 70%, the direct radiance upon the upper cooler stage from objects at 323 K ambient temperature is 0.7×1.7/pi ×62 mW/cm²×0.9 cm²×0.5 W/W, or approximately 10 mW.

Therefore, the total radiative heatload on the coldest stage of cooler 16 can be estimated to be (11+1+10) or approximately 22 mW.

Without the cold shield 26, the detector 18 would be surrounded by 323 K radiation and would receive 62 mW/cm²×0.9 cm²×0.5 W/W, or approximately of 28 mW of flux. Thus, the conventional coldshield has reduced the unwanted flux by approximately 6 mW. Given a typical temperature dependence upon heatload of 3 mW/°C., this conventional coldshield 26 reduces detector 18 temperatures by approximately 2° C. as compared with an unshielded design.

Referring now to the radiation shield of the invention, as shown in FIGS. 2, 3 and 4, the detector 18 sees no temperatures warmer than the 231 K of cooler stage 4, thus it experiences a reflected heatload from the shield of less than 16 mW/cm²×0.97×0.9 cm²×0.5 W/W, or approximately 7 mW.

Thermal conduction from the above-described reflective sheath 48 involves a series path, through the supporting material as well as along the reflective film. It can be shown that the thermal conductivity of a gold film, 700 angstroms thick, 0.24 cm wide, and 0.2 cm long, is approximately 3000 mW/cm K ×(1/0.2 cm)×0.24 cm ×700 angstroms ×10⁻⁸ cm/angstroms, or approximately 0.025 mW/K. Conductivity of the supporting polyimide plastic film, 0.004-inch thick, perfectly contacting a cooler 16 stage edge area of 0.05 cm ×0.24 cm is 1.2 mW/K ×(1/0.01 cm)×0.05 cm ×0.24 cm, or approximately 1 mW/K. Conservatively, thermal conduction through the sheath 48 certainly is no greater than that of the gold film alone. Therefore, with or without the supporting thermally insulating sheath, gold plating of the upper stage sides adds a negligible heatload of 0.025 mW/K ×46 K or approximately 1 mW, which is far less than the radiative load that would be incurred without plating. It should be noted that plating or sheathing of the cooler 16 sides was consistently considered into the overall coldest-stage absorption of 50% employed in all calculations.

Some unwanted flux results from the non-zero emissivity and warm temperature of the reflector 40. At a high reflector temperature of 323 K (+50° C.) and emissivity of 3%, and with a cold stage area of 0.9 cm² and average absorptance of 80%, the cold stage experiences an added radiative heatload of 62 mW/cm²×0.03 W/W ×0.9 cm²×0.5 W/W or approximately 1 mW.

Direct radiance from the aperture 46 again is 10 mW, assuming that the coldstop is unchanged from that of FIG. 1.

Thus, the invention provides for a total radiative heatload of approximate 7+1+1+10=19 mW, or 3 mW less than the 22 mW estimated above for the prior art configuration. Consequently, the detector 18 operates approximately 1.3 K cooler than with the prior art design, for the same thermoelectric cooler operating parameters and for same case-window-shield reflection assumptions.

This lower detector operating temperature improves minimum detectable signal by 5%, based upon typical photovoltaic mercury-cadmium-telluride detector characteristics, and is realized solely by employing the radiation shield of the invention. However, because other aspects of shield design can now be modified other improvements also can be made, as are shown below.

As one variation, if the second stage is used for imaging, instead of the fourth stage just described, the heatload due to coldstage reflections by the shield will increase from 7 mW to 33 mW/cm²×0.97×0.8 cm²×0.5 W/W or approximately 14 mW, but other heatloads will remain the same. Thus, detector temperature will increase by approximately 2.3° C., and minimum detectable signal will be degraded by 9%, relative to the better performance design previously described, again without changing the coldstop location. This variation degrades minimum detectable signal by 4% as compared with the prior art exemplary baseline, but still offers improved ruggedness of construction and other advantages of this invention.

The placement and the concave shape of the conventional coldshield front surface shown in FIG. 1 are chosen to avoid some undesirable system-optics imaging effects. The relatively short height above the detector 18 also avoids placing a large cantilevered mass upon the cooler 16, thereby avoiding structural problems due to the fragility of the cooler 16. However, with the shield of the invention at ambient temperature and mounted to the dewar package the shield exterior can be made absorptive or diffusely reflecting, and still achieve acceptable rejection of images. Also, the shield 40 can be made large and/or massive without posing structural design problems. Therefore, other shapes become feasible such that the aperture 46 can be placed nearer to the window 30. This reduces detector background flux significantly.

Figure 6A:
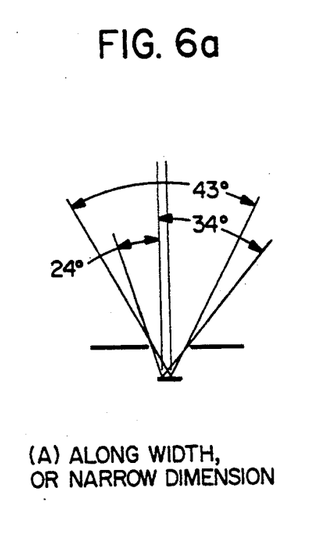
FIGS. 6a and 6b show the conventional coldstop location of the coldshield of FIG. 1 along the narrow and the wide dimensions, respectively, of the detector, the equivalent field of view (FOV) being F/0.2 by F/0.7, corresponding to a F/0.3 circular or 1.7 steradian FOV.
Figure 6B:
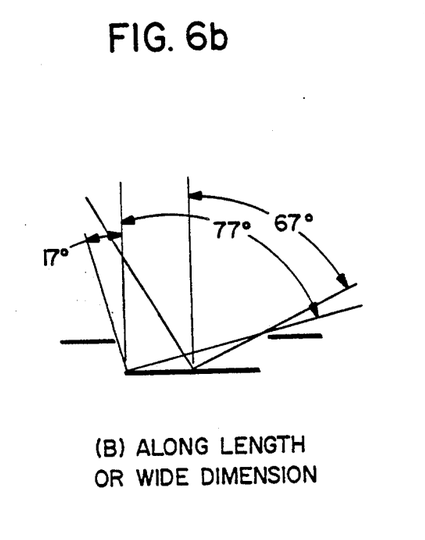

As shown in FIGS. 6a and 6b the conventional stop is only a few detector dimensions above the detector 18 surface, hence the stop is oversized to avoid vignetting. The stop is made effectively F/0.2 in the long array dimension, and F/0.7 in the short dimension. Yet, the imaging ray bundle is contained within an F/1.5 cone, except for effects of pupil wander, and the conventional stop admits only an F/1.1 (24° half-angle cone) without vignetting. Due to its proximity to the detector 18, the conventional stop subtends a large solid angle of approximately 1.7 steradians.

Figure 7A:
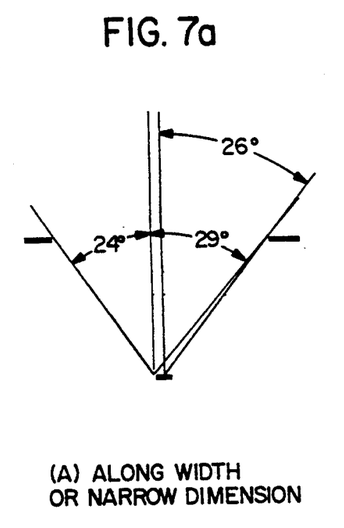
FIGS. 7a and 7b show the coldstop location of the coldshield of FIG. 2 along the narrow and the wide dimensions, respectively, of the detector, the equivalent FOV being F/0.5 by F/1.3, corresponding to a F/0.7 circular or 1.0 steradian FOV.
Figure 7B:
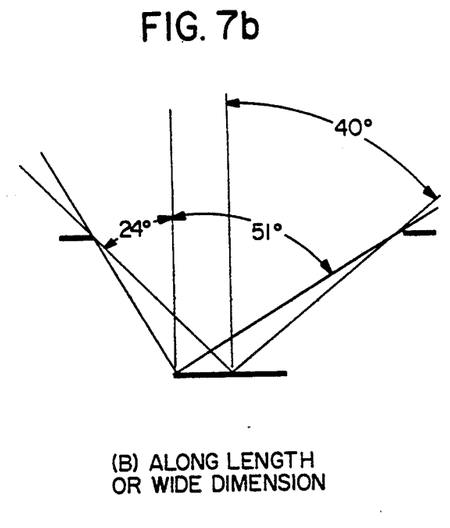
Figure 8:
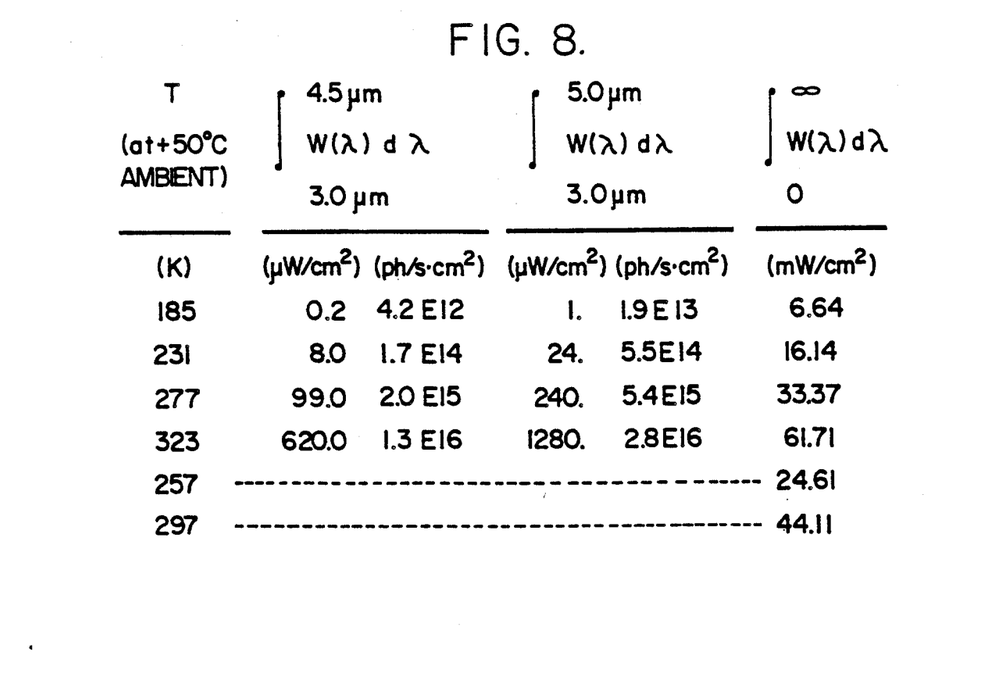
FIG. 8 is a reference table showing radiances emittances and irradiation over various wavelength intervals as a function of blockbody temperature.

If, without changing the dewar envelope, the stop is placed as shown in FIGS. 7a and 7b, a better fit is achieved to the system focal number. This stop, at 0.200-inch height, is approximately F/0.6 by F/1.0, and subtends an equivalent solid angle of approximately 1.0 steradian. It might be inferred that the radiation through the coldstop will be reduced to 1/1.7 or approximately 0.6 of the conventional value. However, a larger improvement results, since the closer spacing to the window 30 inhibits energy emitted by warm surfaces within the dewar from reaching the coldest stage through window reflections. In general, window reflections generally include large amounts of LWIR flux which are well reflected by the MWIR filter coatings typically applied to window 30. Hence, the previously described reflection-coupling efficiency of 70% is reduced to less than 5%. This implies a heatload of less than 1 mW/cm$^2$, as compared with the previous 10 mW/cm$^2$, for flux admitted by the effective coldstop provided by shield 40. This 9 mW/cm$^2$ heatload reduction reduces detector operating temperature another 3 K. Also, detector photon noise depends upon the radiation within the detector sensitive spectral band.

Repeating the above calculations with spectral band limits of 3.0 to 4.5 micrometers, zero to 4.5 micrometers giving similar results, it can be shown that the inband detector irradiance from the coldstop location of FIGS. 6a and 6b is 1.25 10$^{16}$ ph/s cm$^2 \times$0.03 W/W$\times$1.7, or approximately 2.0 10$^{14}$ ph/s cm$^2$. With the modified stop location of FIGS. 7a and 7b, background flux is reduced to 1.2 ph/s cm$^2$. However, at these detector 18 operating temperatures, no significantly useful improvements in photon noise result.

Thus, changing the height of the coldstop location relative to the detector 18 improves minimum detectable signal by 12% and eliminates sources of spurious reflected energy. This improvement is cumulative with the 3% to 4% advantage calculated above resulting from the use of shield 40, giving a total improvement of 15%.

The foregoing radiometric analyses quantify the performance advantages of the radiation shield of the invention and of improvements that it enables in coldstop placement. The improved detector-cooler-dewar unit achieves a minimum detectable signal improvement of approximately 15%, together with better producibility and reliability.

While the above description has been made in the context of a specific embodiment of a thermoelectrically-cooled infrared detector, it is clear that other cryogenically-cooled components can benefit these teachings. This includes, for example, magnetic, electromagnetic, nuclear radiation, or other sensors which require cryogenic cooling and which benefit from energy-restrictive "coldstop" apertures. Indeed, a magnetic or nuclear radiation sensor may require no coldstop aperture inasmuch as the entire radiation shield can be transparent to the energy being sensed. Furthermore the technique also works in reverse for infrared or thermal objects that are to be viewed by external sensing systems. For example, the teaching of the invention is applicable to the construction of calibration targets for thermal imaging systems.

Based on the foregoing teaching those having skill in the art may derive modifications thereto. The invention is therefore not to be considered to be limited to only the embodiments disclosed above but is instead to be limited only as the invention is set forth in the claims which follow.

What is claimed is:

1. A radiation shield for reflecting radiation originating from a cooled surface region away from the surface region, comprising:
    first substantially uncooled reflector means for being positioned relative to the surface region and having an interior surface shape corresponding to a toric segment for reflecting any radiation originating from the surface region away from the surface region; and
    second substantially uncooled reflector means optically coupled to said first reflector means for guiding radiation originating from the surface region and reflecting from said first reflector means away from both said first reflector means and the surface region.

2. A radiation shield as set forth in claim 1 wherein the surface region includes a radiation detector and wherein the first reflector means includes an aperture for admitting radiation for viewing by the detector.

3. A radiation shield as set forth in claim 2 wherein said second reflector means comprises at least one circular cylindrical reflector or at least one rectangular parallelepiped reflector.

4. A radiation shield as set forth in claim 3 wherein said first reflector means has a diameter and wherein said second reflector means has a transverse dimension that is larger than the diameter of said first reflector.

5. A radiation shield as set forth in claim 1 and further comprising third uncooled reflector means having a reflector surface shape corresponding to a toric segment, said second reflector means being interposed between said first reflector means and said third reflector means.

6. A radiation shield as set forth in claim 2 wherein said first reflector means has a diameter and wherein said second reflector means comprises a plurality of serially coupled together circular cylindrical reflectors or rectangular parallelepiped reflectors individual ones of which have a transverse dimension that is larger than the first diameter and that is also larger than transverse dimension of an adjacent circular cylindrical reflector or rectangular parallelepiped reflector that is disposed between the individual one of the second reflectors and said first reflector means.

7. A radiation shield as set forth in claim 2 wherein the surface region further includes an end portion of a detector cooling means, the cooling means being enclosed at least partially by said second reflector means, said second reflector means being substantially thermally isolated from the cooling means.

8. A radiation detector assembly, comprising:
    radiation detecting means having a surface for receiving radiation to be detected;
    cooling means having a first end portion thermally coupled to said detecting means for cooling said detecting means, said cooling means further having a second opposing end portion; and
    radiation shield means disposed around said detecting means and at least partially enclosing a length of said cooling means, said radiation shield means comprising:
    first reflector means including aperture means for admitting radiation to the surface of said detecting means, said first reflector means having a surface shape corresponding to a toric segment and facing said detector means for reflecting radiation originating from the surface of said detecting means away from the surface of said detecting means;

second reflector means coupled to said first reflector means for guiding radiation reflecting from said first reflector means away from said first reflector means and towards the second end of said cooler means; and absorber means positioned for disposing of radiation either reflected by said first and said second reflector means or radiation directly incident thereon.

9. A radiation detector assembly as set forth in claim 8 wherein said absorber means is further positioned for disposing of radiation admitted by said aperture means but not incident upon said detecting means.

10. A radiation detector assembly as set forth in claim 8 wherein said cooling means comprises a thermoelectric cooler having a plurality of cooling stages thermally coupled one to another in a serial manner, said stages being of increasing temperature and increasing lateral dimension from the first end to the second end.

11. A radiation detector assembly as set forth in claim 10 wherein at least a stage or stages nearest to said detecting means and enclosed by said shield means further comprise a thermally insulating sheath surrounding said stage or stages, said sheath having an outer reflective surface.

12. A radiation detector assembly as set forth in claim 11 wherein at least one of said stages includes a substantially planar member extending outwardly from a laterally disposed surface thereof, said member having a radiation reflective bottom surface facing said second end and a radiation absorptive top surface facing said first end.

13. A radiation detector assembly as set forth in claim 8 wherein the toric segment shape of said first reflector means is substantially defined by the pivoting of a generating point from approximately a perimeter of said detecting means.

14. A radiation detector assembly as set forth in claim 8 wherein said shield means is substantially thermally isolated from said cooling means.

15. A radiation detector assembly as set forth in claim 8 and further comprising dewar vessel means for containing said detecting means, said cooling means and said radiation shield means, said dewar vessel means having a window positioned for admitting radiation to said aperture means.

16. A radiation detector assembly as set forth in claim 8 wherein said detecting means comprises an infrared detector.

17. In a radiation detector assembly having an IR radiation detector thermally coupled to an upper stage of a thermoelectric cooler for cooling the detector to a desired operating temperature, a method of decreasing a heat load upon the upper stage of the thermoelectric cooler, comprising the steps of:

reflecting thermal radiation emanating from the detector and from an upper surface of the upper stage, the thermal radiation being reflected to a position below the upper stage with a first uncooled reflector having a reflecting surface having the shape of a toric segment;

guiding the reflected thermal radiation down along the cooler and towards a warmer, lower stage by reflecting the thermal radiation with at least one second substantially uncooled reflector that is spaced apart from and that surrounds the upper stage; and absorbing the thermal radiation at a position away from and below the upper stage.

18. A method as set forth in claim 17 wherein the step of guiding further includes a step of reflecting the radiation with a reflective surface disposed upon a thermally insulating sheath which encircles the upper stage.

19. A method as set forth in claim 18 wherein the desired operating temperature is approximately 185 K.

20. In a thermoelectric cooler assembly for use with a component requiring cooling to cryogenic temperatures, a method of decreasing a heatload upon an upper stage of the thermoelectric cooler assembly, comprising the steps of:

reflecting thermal radiation emanating from the component and from an upper surface of the upper stage, the thermal radiation being reflected with a first substantially uncooled reflector to a position below the upper stage;

guiding the reflected thermal radiation down along the cooler assembly and towards a warmer, lower stage by reflecting the thermal radiation with at least one second substantially uncooled reflector which is spaced apart from and which surrounds the upper stage;

absorbing the reflected thermal radiation at the lower stage, the lower stage being provided with upper and/or side surfaces absorptive of thermal radiation; and reflecting, with the second uncooled reflector, thermal radiation emanating from lower stages back upon themselves, thus inhibiting radiative transfer from warmer stages to cooler stages.

21. A method as set forth in claim 20 and further comprising a step of guiding and containing thermal radiation by encasing portions of the thermoelectric cooler assembly in a reflective sheath.

22. A method as set forth in claim 20 and including an initial step of positioning an entrance aperture means relative to the component and to a window means such that reflections from surfaces disposed external to the first and the second reflectors are substantially inhibited from being reflected from the window means and onto the component and/or the upper surface of the upper stage.

23. In a detector assembly having a detector thermally coupled to an upper stage of a thermoelectric cooler for cooling the detector to a desired operating temperature, apparatus for decreasing a heat load upon the upper stage of the thermoelectric cooler comprising:

first substantially uncooled means for reflecting thermal radiation emanating from the detector and from an upper surface of the upper stage, the thermal radiation being reflected to a position below the upper stage;

means for guiding the reflected thermal radiation down along the cooler and towards a warmer, lower stage, the means for guiding comprising second substantially uncooled means for reflecting that is spaced apart from and that surrounds at least the upper stage; and means for absorbing the thermal radiation at a position below the upper stage.

24. Apparatus as set forth in claim 23 wherein the means for guiding further comprises a reflective surface disposed upon an outer surface of a thermally insulating sheath, an inner surface of the sheath being disposed around and in contact with the upper stage.

25. Apparatus as set forth in claim 23 wherein the first substantially uncooled means for reflecting has a reflecting surface having the shape of a toric segment.

26. Apparatus as set forth in claim 23 wherein the means for absorbing comprises at least one surface of a lower stage of the cooler.

* * * * *